United States Patent [19]
Nakano et al.

[11] Patent Number: 5,796,131
[45] Date of Patent: Aug. 18, 1998

[54] METAL SEMICONDUCTOR FIELD EFFECT TRANSISTOR (MESFET) DEVICE WITH SINGLE LAYER INTEGRATED METAL

[75] Inventors: Kenichi Nakano, Beavercreek; Christopher A. Bozada, Dayton; Tony K. Quach, Kettering; Gregory C. DeSalvo, Beavercreek; G. David Via; Ross W. Dettmer, both of Dayton; Charles K. Havasy; James S. Sewell, both of Kettering; John L. Ebel, Beavercreek; James K. Gillespie, Cedarville, all of Ohio

[73] Assignee: The United States of America as represented by the Secretary of the Air Force, Washington, D.C.

[21] Appl. No.: 684,759

[22] Filed: Jul. 22, 1996

[51] Int. Cl.$^6$ .................................................. H01L 29/80
[52] U.S. Cl. .................................. 257/284; 257/192
[58] Field of Search .................................. 257/284, 192, 257/744, 472

[56] References Cited

U.S. PATENT DOCUMENTS

| | | | |
|---|---|---|---|
| 3,764,865 | 10/1973 | Napoli et al. | 317/235 |
| 3,855,690 | 12/1974 | Kim et al. | 29/571 |
| 3,861,024 | 1/1975 | Napoli et al. | 29/579 |
| 3,943,622 | 3/1976 | Kim et al. | 29/579 |
| 4,961,194 | 10/1990 | Kuroda et al. | 357/22 |
| 5,698,870 | 12/1997 | Nahano et al. | 257/194 |
| 5,698,900 | 12/1997 | Bozada et al. | 257/194 |

OTHER PUBLICATIONS

Ohmic Contacts to n–GaAs Using Graded Band Gap Layers of $Ga_{1-x}In_xAs$ Grown by Molecular Beam Epitaxy, authored by J.M. Woodall et al., p. 626 in the J. Vac. Sci. Technol. vol. 19, No. 3, Sep./Oct. 1981.

HEMT with Nonalloyed Ohmic Contacts Using $n^+$–InGaAs Cap Layer, authored by S. Kuroda et al., p. 389 in the IEEE Electron Device Letters, vol. EDL–8, No. 9, Sep. 1987.

Extremely Low Nonalloyed and Alloyed Contact Resistance Using an InAs Cap Layer on InGaAs by Molecular–Beam Epitaxy, authored by C.K. Peng et al., p. 429 in the J. Appl. Phys. vol. 64, No. 1, Jul. 1, 1988.

Non–Alloyed Ohmic Contacts to n–GaAs Using Compositionally Graded $In_xGa_{1-x}As$ Layers, authored by T. Nittono et al., pp. 1718–1722 in the Japanese Journal of Applied Physics, vol. 27, No. 9, Sep. 1988.

Extremely Low Contact Resistances for AlGaAs/GaAs Modulation–Doped Field–Effect Transistor Structures, authored by A. Ketterson et al., p. 2305 in the J. Appl. Phys. vol. 57, No. 6, Mar. 1985.

Single–Cycle Lithography Process for Both Large and Sub–Half Micron Features, authored by J.S. Sewell et al., p. 177 in the SPIE, vol. 1671, Mar. 3, 1992.

A Combined Electron Beam/Optical Lithography Process Step for the Fabrication of Sub–Half–Micron–Gate–Length MMIC Chips, authored by J.S. Sewell et al., and appearing in the Conference Proceedings of the Fourth National Technology Transfer Conference and Exposition, Dec. 7–9, 1993, Anaheim, California, NASA Conference Publication 3249, vol. 1, p. 54.

(List continued on next page.)

*Primary Examiner*—Mark V. Prenty
*Attorney, Agent, or Firm*—Gerald B. Hollins; Thomas L. Kundert

[57] ABSTRACT

A periodic table group III–IV metal semiconductor metal field-effect transistor device is described. The disclosed device includes single metalization for ohmic and Schottky barrier contacts, an elective permanent etch stop layer, a non-alloyed ohmic contact semiconductor layer and a permanent non photosensitive secondary mask element. The invention may be achieved with one of an all optical lithographic process and a combined optical and electron beam lithographic process The disclosed field-effect transistor device is of reduced fabrication cost, increased dimensional accuracy and state of the art electrical performance.

22 Claims, 5 Drawing Sheets

OTHER PUBLICATIONS

Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP, authored by G.C. DeSalvo et al., p. 831 in the J. Electrochem. Soc., vol. 9, No. 3, Mar. 1992.

Citric Acid Etching of $GaAs_{1-x}Sb_x$, $Al_{0.5}Ga_{0.5}Sb$, and InAs for Heterostructure Device Fabrication, authored by G.C. DeSalvo et al., p. 3526 in the J. Electrochem. Soc., vol. 141, No. 12, Dec. 1994.

High–Performance Self–Aligned $p^+/n$ GaAs Epitaxial JFET's Incorporating AlGaAs Etch–Stop Layer, authored by J.K. Abrokwah et al., p. 1529 in the IEEE Transactions on Electron Devices, vol. 37, No. 6, Jun. 1990.

Making a High–Yield, 0.33 Micron, MBE–Based GaAs MMIC Production Process, authored by R.D. Remba et al., p. 90 in the proceedings of the 1994 U.S. Conference on GaAs Manufacturing Technology (MANTECH), May 1994.

Simplified Ohmic and Schottky Contact Formation for Field Effect Transistors Using the Single Layer Integrated Metal Field Effect Transistor (SLIMFET) Process, authored by G.C. DeSalvo et al., p. 314 in the IEEE Transactions on Semiconductor Manufacturing, vol. 8, No. 3, Aug. 1995.

All–Refactory GaAs FET Using Amorphous $TiWSi_x$ Source/Drain Metallization and Graded–$In_xGa_{1-x}As$ Layers, authored by N.A. Papanicolaou et al., p. 7 in the IEEE Electron Device Letters, vol. 15, No. 1, Jan. 1994.

A New Fabrication Technology for AlGaAs/GaAs HEMT LSI's Using InGaAs Nonalloyed Ohmic Contacts, authored by S. Kuroda et al., p. 2196 in the IEEE Transactions on Electron Devices, vol. 36, No. 10, Oct. 1989.

A Highly Manufacturable 0.2 μm AlGaAs/InGaAs PHEMT Fabricated Using the Single–Layer Integrated–Metal FET (SLIMFET) Process, authored by Charles K. Havasy et al., appearing in the IEEE Gallium Arsenide Integrated Circuit Symposium, Conference Proceedings, San Diego, CA, Oct. 1995.

METAL SEMICONDUCTOR FIELD EFFECT TRANSISTOR (MESFET) DEVICE WITH SINGLE LAYER INTEGRATED METAL

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the copending and commonly assigned patent application documents "Single Layer Integrated Metal Process for Metal Semiconductor Field-Effect Transistor (MESFET)", Ser. No. 08/684,760; "High Electron Mobility Transistor (HEMT) and Pseudomorphic High Electron Mobility Transistor (PHEMT) Devices With Single Layer Integrated Metal", Ser. No. 08/684,756, now U.S. Pat. No. 5,698,870 "Single Layer Integrated Metal Process for High Electron Mobility Transistor (HEMT) and Pseudomorphic High Electron Mobility Transistor (PHEMT)", Ser. No. 08/684,761; "Field-Effect Transistor Process With Semiconductor Mask, Single Layer Integrated Metal, and Dual Etch Stops", Ser. No. 08/684,755; and "Field-Effect Transistor Device With Single Layer Integrated Metal and Retained Semiconductor Masking", Ser. No. 08/684,734 now U.S. Pat. No. 5,698,900 which are all filed of even date herewith. The contents of these related applications are hereby incorporated by reference herein.

BACKGROUND OF THE INVENTION

This invention relates to field-effect transistor structure.

The present invention achieves the goal of a field-effect transistor having single metalization for both gate contact and source/drain contact elements. The invention provides the needed Schottky barrier characteristics at the gate contact and the needed ohmic junction characteristics at the source/drain contacts respectively using a single metalization arrangement which is notably practical and economically viable. The invention arises from compromise between several semiconductor device disciplines—including material growth, device metalization, and material deposition. The disclosed field-effect transistor is technically and economically viable for use in analog transistor applications extending to the microwave and millimeter wave spectral regions for example.

Several concepts appearing in the present invention also appear in the patent and publication literature as stand-alone concepts, concepts used in a different setting or concepts combined in less than the combination contemplated in the present invention. The present invention is however, believed to represent a novel and unobvious combination of such concepts to achieve a useful result. The concept of using the same metal in parts of the source, drain and gate structure of a field-effect transistor for example appears in a certain form in transistors fabricated some years ago when the self aligned gate structure was new in the art. Examples of this same metal concept appear for example in the two related RCA patents of Napoli et al., U.S. Pat. No. 3,764,865 and U.S. Pat. No. 3,861,024. The same metal concept also appears in the two related Westinghouse Patents of Kim, U.S. Pat. No. 3,855,690 and U.S. Pat. No. 3,943,622.

In each of these four patents however, the disclosed transistor involves use of a common metal to connect to an already formed source/drain ohmic contact and to form the Schottky barrier gate contact. In the silicon material used in the devices of these four patents an ohmic contact is moreover achieved with the mere addition of another layer of material and does not require the alloying, annealing and other complexities needed for a group III–V semiconductor device ohmic contact. The present invention is believed distinguished over the disclosure of these older patents by its use the same metal to actually form the gate contact as to form the source/drain contacts of the transistor. Moreover in the present invention these source/drain contacts are achieved in a non alloy fashion.

The U.S. Pat. No. 4,961,194 of S. Kuroda et al., describes gallium arsenide MESFET and HEMT devices which use the combination of non-alloyed ohmic contacts, same metal electrodes, acetone solvent removal of photoresist coatings, ion implanted device separation areas, selective etching and etch stopping at the surface of a device layer. Although each of these concepts may be used in the present invention additional concepts not disclosed in the Kuroda et al. patent are also a part of the present invention and provide significant distinction over the Kuroda et al. Patent. The Kuroda et al. patent for example does not disclose the use of a permanent secondary mask and passivation material layer nor the concept of a gate aperture recess received in a gate window nor the precise and time effective termination of etching operations as is accomplished in applicants' invention. In view of the similar areas of work and in the interest of minimizing the size of the present patent document, the contents of the of S. Kuroda et al. 4,961,194 patent are hereby incorporated by reference herein.

An article published in the technical literature some years ago is also of interest with respect to the present single metal concept and is additionally of interest with respect to use of non-alloyed ohmic contacts in a field-effect transistor. This article "A New Fabrication Technology for AlGaAs/GaAs HEMT LSI's Using InGaAs Non-alloyed Ohmic Contacts" is authored by S. Kuroda et al., apparently the same S. Kuroda et al., as named In the above identified 4,961,194 United States Patent, and appears at page 2196 in the Institute of Electrical and Electronic Engineers Transactions on Electron Devices, Volume 36, number 10, October, 1989. This Kuroda article is in fact of an especially enlightening contrast nature with respect to the present invention since it teaches the use of a complex etching sequence during formation of an element and the present invention avoids use of this sequence in favor of a more practical and less costly procedure.

In a somewhat related situation the technical article "All-Refractory GaAs FET Using Amorphous TiWSi$_x$ Source/Drain Metalization and Graded In$_x$Ga$_{1-x}$As Layers" authored by N. Papanicolaou which appears at page 7 in the Institute of Electrical and Electronic Engineers Electron Devices Letters, volume 15, number 1, January, 1994 discloses the use of non-alloyed ohmic contacts in a gallium arsenide field-effect transistor. The Papanicolaou article however, relates to the fabrication of a high temperature field-effect transistor device, a device having refractory metal elements and involving the use of Tungsten metal. The Papanicolaou article also presents an informative discussion of the non-alloyed ohmic contact art.

The inventors of the present invention have also found the textbook "Modem GaAs Processing Methods" authored by Ralph Williams, Artech House, of Boston and London, to be of assistance in explaining and understanding certain aspects attending the present invention including its relationship with the prior art. In the further interest of minimizing the size of the present patent document, the contents of the of this Ralph Williams, Artech House textbook are therefore hereby incorporated by reference herein. Non-alloyed ohmic contacts are additionally disclosed in several published technical journal articles as follows.

1. Ohmic Contacts to n-GaAs Using Graded Band Gap Layers of $Ga_{1-x}In_x$ As Grown by Molecular Beam Epitaxy, authored by J. M. Woodall et al., and appears at page 626 in the J. Vacuum. Science. Technology. Vol 19, number 3, September/October 1981.
2. HEMT with Non-alloyed Ohmic Contacts Using $n^{30}$-InGaAs Cap Layer, authored by S. Kuroda et al., and appears at page 389 in the IEEE Electron Device Letters, Volume EDL-8, number 9, September 1987.
3. Extremely Low Non-alloyed and Alloyed Contact Resistance Using an InAs Cap Layer on InGaAs by Molecular-Beam Epitaxy, authored by C. K. Peng et al., and appears at page 429 in the J. Applied. Physics. Volume 64, number 1, Jul. 1, 1988.
4. Non-Alloyed Ohmic Contacts to n-GaAs Using Compositional Graded $In_xGa_{1-x}As$ Layers, authored by T. Nittono et al., and appears at pages 1718–1722 in the Japanese Journal of Applied Physics, Volume 27, number 9, September 1988.
5. Extremely Low Contact Resistances for AlGaAs/GaAs Modulation-Doped Field-Effect Transistor Structures, authored by A. Ketterson et al., and appears at page 2305 in the J. Applied. Physics. Volume 57, number 6.

Although each of these documents from the prior art may relate to an aspect of the present invention it is believed that the invention as described herein represents the first combination of the plurality of concepts and compromises necessary to achieve a successful single metal, non-alloyed contact, selective etching-achieved, and secondary mask-inclusive field-effect transistor.

SUMMARY OF THE INVENTION

The present invention provides for a field-effect transistor of simplified structure and low cost manufacturing process. The invention adds a structural element, a masking/electrically insulating/passivating layer, which is useful in both the fabrication sequence and as an element of the completed transistor.

It is an object of the present invention therefore to provide a metal semiconductor metal field-effect transistor having the combination of a permanent secondary mask element and non alloyed ohmic source and drain contacts.

It is another object of the present invention to provide a simplified and lower cost field-effect transistor.

It is another object of the invention to provide a field-effect transistor in which a mask layer used during fabrication etching steps is beneficially allowed to remain in the completed device.

It is another object of the present invention to provide a periodic table group III-V field-effect transistor in which a dielectric material mask layer used during fabrication etching steps is employed as a completed device passivation layer.

It is an object of the invention to provide a field-effect transistor of simplified metal structure.

It is an object of the invention to provide a field-effect transistor which includes periodic table group III-V materials of the gallium arsenide, indium phosphide or other types.

It is another object of the present invention to provide a field-effect transistor in which certain lithographic and metal deposition steps for forming a Schottky gate contact element have also formed the transistor drain/source ohmic contact elements.

It is another object of the invention to provide a field-effect transistor improved through use of indium gallium arsenide cap layer-enabled non-alloyed ohmic contacts of low electrical contact resistance.

It is another object of the invention to provide a field-effect transistor improved through use of an indium gallium arsenide capping layer and ohmic contacts of low electrical resistance.

It is another object of the invention to provide a field-effect transistor in which a GaAs cap layer is replaced with a cap layer of graded composition.

It is another object of the invention to provide a field-effect transistor in which a permanent secondary mask element is used.

It is another object of the invention to provide a field-effect transistor in which a secondary mask element enables use of non-alloyed ohmic contacts.

It is another object of the invention to provide a field-effect transistor arrangement which is relatively insensitive to process-induced variations and therefore provides material growth characterization capability.

It is another object of the invention to provide a field-effect transistor which provides consistent low resistance electrical contacts.

It is another object of the invention to provide a field-effect transistor in which electrical contact alloying problems and resulting contact variability are avoided.

It is another object of the invention to provide a field-effect transistor which avoids a critical alignment step through use of common ohmic contacts and gate region metalizations.

Additional objects and features of the invention will be understood from the following description and claims and the accompanying drawings.

These and other objects of the invention are achieved by a partially completed contact-included structure for a group III-V semiconductor material, secondary mask-inclusive metal semiconductor metal field-effect transistor comprising the combination of:

a transistor-divided group III-V semiconductor material field-effect transistor wafer having a channel layer and a superimposed group III-V semiconductor material-inclusive ohmic connection layer that is overlaid by a group III-V semiconductor material-inclusive permanent secondary mask layer;

a photoresist mask layer covering said group III-V semiconductor material-inclusive permanent secondary mask layer;

a gate window recess disposed in a transistor-divided region of said wafer and extending through said photoresist mask layer, said permanent secondary mask layer, said ohmic connection layer and said first etch stop layer to said channel layer;

source and drain region openings disposed in said transistor-divided region on opposed lateral sides of said gate window recess and extending through said photoresist mask layer and said secondary mask layer to said ohmic connection layer;

a Schottky barrier metal electrical contact received in said gate window recess on said channel layer;

a non-alloyed ohmic source electrical contact of said same Schottky barrier metal received on said ohmic connection semiconductor material layer in said source location;

a non-alloyed ohmic drain electrical contact of said same Schottky barrier metal received on said ohmic connection semiconductor material layer in said drain location.

DETAILED DESCRIPTION

FIG. 2 in the drawings shows a fabrication sequence of cross sectional layer views of one type of field-effect transistor, the well known Metal Semiconductor Field-Effect Transistor (MESFET) which is adapted in accordance with the present SLIMFET (Single Layer Integrated Metal Field-Effect Transistor) invention. The FIG. 2 fabricated MESFET device is in fact distinguished from other field-effect transistor structures by an absence of certain layers of semiconductor material. The devices of the above identified Ser. No. 08/684,756: High Electron Mobility Transistor (HEMT) and Pseudomorphic High Electron Mobility Transistor (PHEMT) Devices With Single Layer Integrated Metal and the Ser. No. 08/687,761: Single Layer Integrated Metal Process for High Electron Mobility Transistor (HEMT) and Pseudomorphic High Electron Mobility Transistor (PHEMT) patent documents for example disclose field-effect transistors having two additional layers in comparison with the structure of the FIG. 2 drawing. The transistor of these documents also has semiconductor material doping differences in certain layers with respect to the transistor of the present invention.

Figure 1:
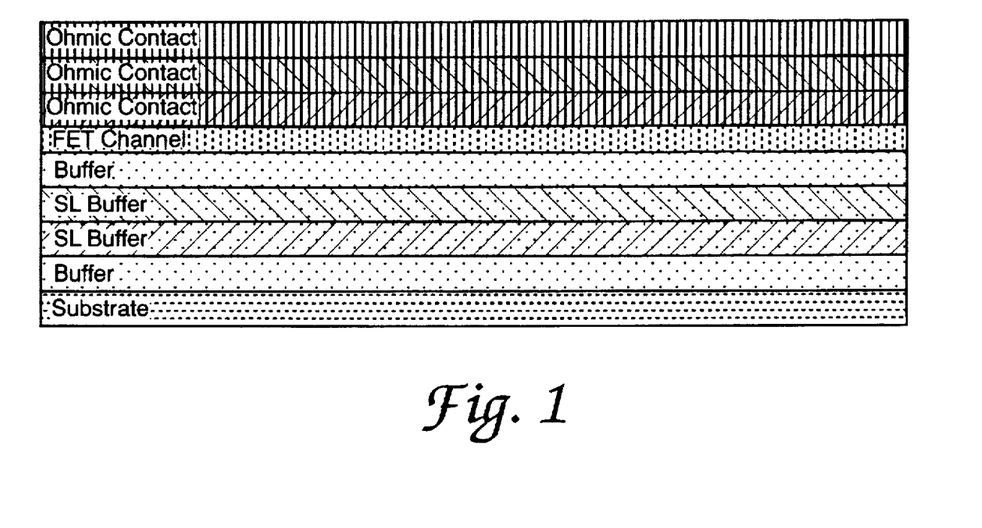
FIG. 1 shows an all-layer and non scaled cross sectional view of a metal semiconductor metal transistor (a MESFET) in accordance with the invention.
Figure 2A:
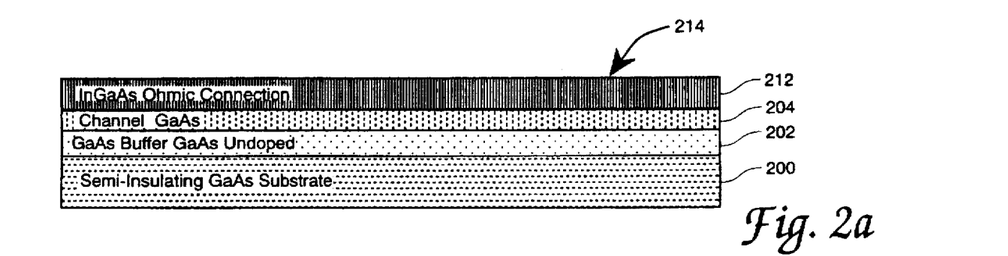
FIG. 2a shows an initial structure usable to achieve the FIG. 2 field-effect transistors.

Fabrication of a MESFET device according to the present invention may start with a wafer of semi-insulating semiconductor substrate material such as the substrate member 200 in FIG. 2a of the drawings or with a wafer having each of the several layers represented in FIG. 2a already formed or alternately may start with a purchased wafer of some intermediate status, a wafer having the substrate 200, the buffer layer 202 and the channel layer 204 previously formed for example. Wafers having all of the layers represented in FIG. 2a may be obtained to specification, e.g., according to the Table A specification below, or as standard products from several suppliers to the integrated circuit art. Suppliers such as Picogiga Corporation and QED Incorporated may be used as a source of such wafers. The wafers having some intermediate number of predisposed layers should also be available from such sources. Selection from these starting point options for the present invention is therefore primarily a matter of available resources and economic considerations.

In the FIG. 2a view of a wafer segment, a field-effect transistor channel layer 204 is shown to be received on a buffer layer 202 which is supported by a substrate 200. This channel layer is in turn covered by an ohmic contact layer 212. The layers of the FIG. 2a wafer 214 may be comprised of the materials indicated in the FIG. 2a drawing and may have the thickness, doping levels and other characteristics indicated in Table A below.

TABLE A (MESFET STRUCTURE)

| Line No. | Purpose | Semi-conductor | Doping Concentration (cm$^{-3}$) | Layer Thickness | FIG. 2a Reference |
|---|---|---|---|---|---|
| 1. | Ohmic Contact | $In_{0.5}Ga_{0.5}As$ | $n = 2 \times 10^{19}$ | 500 Å | 212 |
| 2. | Ohmic Contact | $In_{0.5}Ga_{0.5}As$ graded to GaAs | $n = 2 \times 10^{19}$ | 500 Å | 212 |
| 3. | FET Channel | GaAs | $n = 2 \times 10^{17}$ | 2000 Å | 204 |
| 4 | Buffer | GaAs (or GaAs/AlGaAs) superlattice | undoped | 2500+ Å | 202 |
| 5 | Substrate | GaAs | semi-insulating | — | 200 |

Certain additional routine or standard layers in addition to those shown in FIG. 2 are often used in the fabrication of a MESFET device. These additional layers may include for example layers which are found to be convenient in view of the processing equipment used. The graded ohmic contact layer 212 may for example be fabricated using the gas-based analog-like metal organic chemical vapor deposition, MOCVD, process. In such a fabrication arrangement the gas concentrations are continuously varied as the layer is formed so that the composition of the layer varies along its top to bottom dimension. The ohmic contact layer 212 may alternately be formed however, using the more digital-like molecular beam epitaxy or MBE process, (which is implied in Table A) through the mechanism of forming a series of thin layers of varying composition, i.e., through the formation of a plurality of superlattice layers.

In a somewhat related manner the recitation of routine or processing-related layers in the claims of this document is considered to be an undue limitation of the scope of these claims, especially in instances wherein an alternate arrangement transistor—a transistor including alternate fabrication-related or standard layer structure, could be asserted to avoid claims reciting different or no such layers. Similarly certain non semiconductor material layers are usually needed but are omitted in table A above. Certain claims appended to the present specification therefore also omit routine or standard layer language and are in many instances couched in terms of essential or functional layers language.

Before departing from the subject of Table A it appears worthy of note that the information in this table represents a specification framework for fabricating the FIG. 2a starting point structure using processing equipment and expertise available to the present inventors. The leftmost table A column shows table line numbers, the rightmost column shows a Table-line to FIG. 2a layer relationships for several lines in Table A. The layers recited in this Table A data when formed by molecular beam epitaxy (MBE) or MOCVD for example are of a single crystal nature. Table A by reason of this MBE/MOCVD relationship does not include certain later occurring additional structure such as photoresist masking layers, metalization layers or ion implant achieved regions in its contents; these additions are of course not of MBE/MOCVD origin, nor of a single crystal nature. Such additional structure is recited below in discussing the FIG. 2 step sequence structure however. The term "FIG. 2" is used to refer collectively to the several views of FIG. 2a through FIG. 2k herein.

Although the purpose of each line in Table A i.e., the contribution to transistor function which results from each line of this table will be apparent to those skilled in the transistor fabrication art, the following brief description of these line to function relationships may also be helpful. The ohmic contact layer 212 in FIG. 2a and in lines 1 and 2 of Table A provides successive material changes useful in accomplishing low electrical resistance charge carrier flow through a non-alloyed ohmic electrical connection with the transistor being fabricated. The channel layer of line 3 in Table A is the location of charge carrier flow between source and drain of the FIG. 2 transistor. The buffer layer 202 of FIG. 2 and line 4 in table A serves as a crystallographic interface between the lattice structure of the substrate 200 and the differing lattice structure of the channel layer 204.

The single crystal or epitaxial layers on the wafer 214 can actually be accomplished using either molecular beam epitaxy (MBE), metal organic chemical vapor deposition (MOCVD) or possibly other related growth techniques. The invention uses highly doped InGaAs layers or other low energy bandgap material compatible with the underlying FET layers as the cap layer or ohmic contact layer 212 to form non-alloyed ohmic contacts using known Schottky refractory metalization procedures.

Figure 2B:
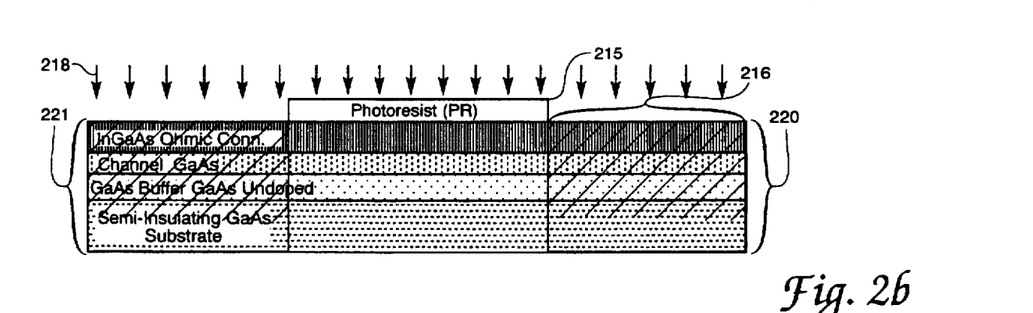
FIG. 2b shows the FIG. 2a structure after an additional processing step.
Figure 2C:
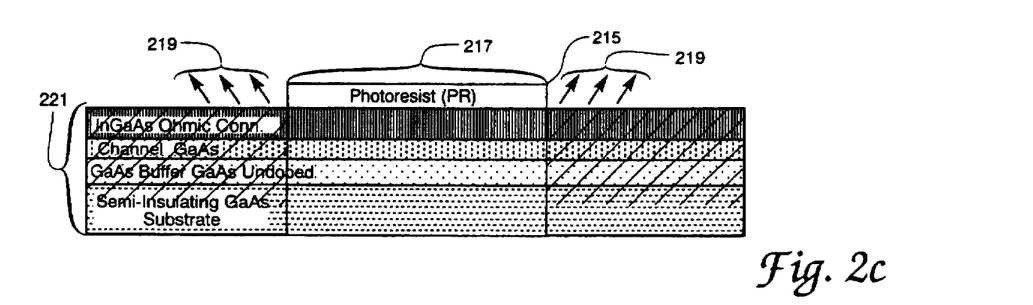
FIG. 2c shows the FIG. 2b structure after an additional processing step.

Continuing with a discussion of the other drawings in the FIG. 2 series, an ion implantation isolation of adjacent transistors on a wafer, an implantation as represented at 218 in FIG. 2b, may be used to achieve adjacent transistor isolation in the layers below ohmic contact layer 212. Such implanting, with oxygen ions for example, is preferably accomplished through use of the single dual use mask indicated at 215 in FIGS. 2b and 2c —in order to avoid a tedious and error prone mask realignment step. FIG. 2b in the drawings therefore shows the addition of the lithographically configured photoresist mask 215 over the ohmic contact layer 212 of FIG. 2a. This dual use mask 215 may be made of the photoresist materials PMGI and 1813 made by Micrographic Chemical Corporation (MCC) and by Shipley Corporation of Newton, Mass. and Marlborough, Mass. respectively. The multiple-layered isolation regions achieved by such ion implantation are shown at 220 and 221 in FIG. 2b.

By way of additional explanation, since the InGaAs of the ohmic contact layer 212 once formed in its heavily doped and electrically conducting condition is not easily made nonconducting, an actual removal of this material in the isolation regions between adjacent transistors of a wafer is desirable. Several techniques for etching this ohmic contact layer 212 material away are available. Standard photolithography processes which define the desired transistor active region 217 by way of the mask 215 and enable a selective mesa isolation wet etch in the non active heavily doped regions 216 can for example be used. Removal of the ohmic contact layer 212 material is indicated at 219 in FIG. 2c. The appearance of the ion implanted regions 220 and 221 after removal of implant region portions of the ohmic layer 212 is shown at 224 and 226 in FIG. 2d. The photoresist mask 215 has also been removed in the FIG. 2d drawing.

Figure 2D:
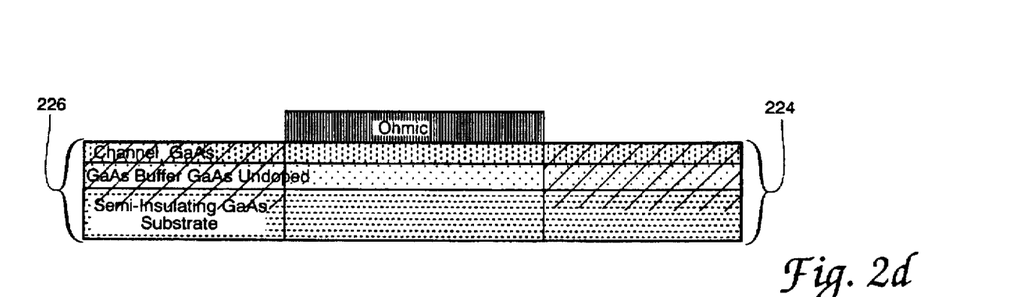
FIG. 2d shows the FIG. 2c structure after an additional processing step.
Figure 2E:
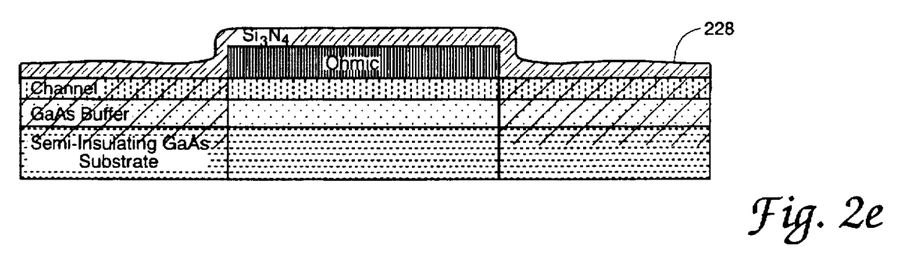
FIG. 2e shows the FIG. 2d structure after an additional processing step.

FIG. 2e shows the deposition of a secondary mask layer 228 over the FIG. 2d structure. This secondary mask layer is preferably made from silicon nitride or silicon dioxide material or other materials of similar type in the presently described embodiment of the invention—in order to provide non photoresponsive, permanence and temperature immunity characteristics in the secondary mask layer 228. These are also materials which can be selectively removed from specific areas of the secondary mask layer 228 without harm to adjacent portions of the transistor in a later portion of the fabrication sequence.

The secondary mask layer 228 serves as a combination of a masking material for a mask used in a subsequent fabrication step, as a selectively removable masking material which is non responsive to certain photoresist mask removal materials, as a heat resistant electrical insulator on which metallic conducting material can be deposited and as a permanent covering layer which is not detrimental to performance in the completed transistor. Since a major part of this secondary mask layer 228 remains in the finished transistor, it also provides a desirable degree of passivation and protection of the completed transistor's exposed surface (i.e., the non-metal covered surface portions) from contamination and physical damage. For present discussion purposes the masking one of these secondary mask layer 228 functions is of primary interest. Indeed without the masking capabilities arising from this secondary mask layer 228, and especially the later described benefits of such a mask in precluding another very critical mask realignment operation, the benefits of the present invention could not be achieved.

The secondary mask layer 228 may be deposited using a plasma enhanced chemical vapor deposition (PECVD) sequence and is preferably deposited to a thickness of 500 Angstroms. This layer 228 is often referred-to herein as a secondary mask layer, such references being in relation to its function in the fabrication sequence of protecting the field-effect transistor ohmic layer during gate window recess etching. Notably in the presently described embodiment of the invention the mask layer 228 is omitted from the Table A described layers of the transistor; this is of course in keeping with the fact that the indicated silicon nitride and silicon dioxide materials do not lend to either MBE fabrication or single crystal relationships with the underlying FIG. 2 layers.

Figure 2F:
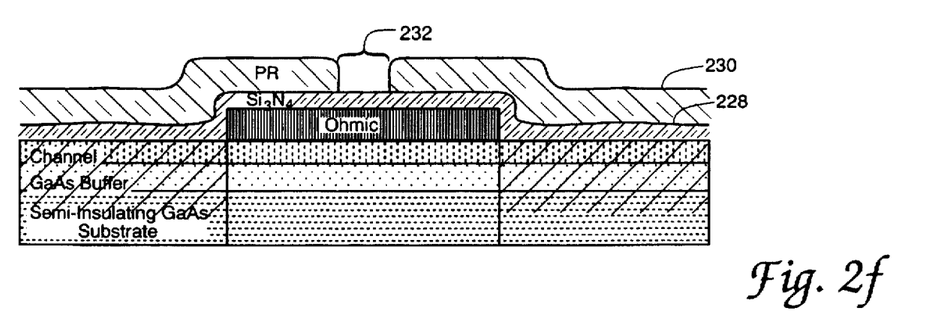
FIG. 2f shows the FIG. 2e structure after an additional processing step.
Figure 2G:
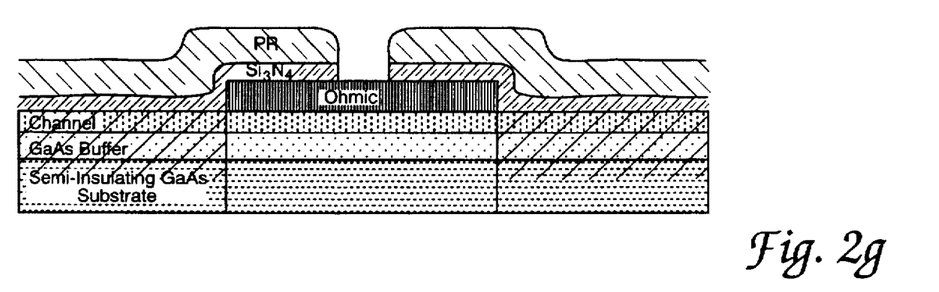
FIG. 2g shows the FIG. 2f structure after an additional processing step.

FIG. 2f of the drawings shows a photoresist layer 230 to be added to the FIG. 2e structure and a gate recess aperture or gate window opening 232 to have been formed photolithographically in this photoresist layer. The recess aperture 232 of course provides access to the secondary mask layer 228 in order that it can be removed from the gate window area during a subsequent selective etching. Removal of the secondary mask layer 228 material in the aperture 232 of the photoresist layer 230 to leave the desired gate window recess in the secondary mask layer 228 and accomplish exposure of the ohmic contact layer 212 material is represented in FIG. 2g. A buffered oxide etch (BOE) solution is used to remove the secondary mask layer 228 in the gate window opening 232; this solution may be composed of BOE and water using the volumetric ratio of one to one. The BOE solution may be composed of one part hydrofluoric acid and seven parts ammonium fluoride and may be purchased or locally mixed.

Figure 2H:
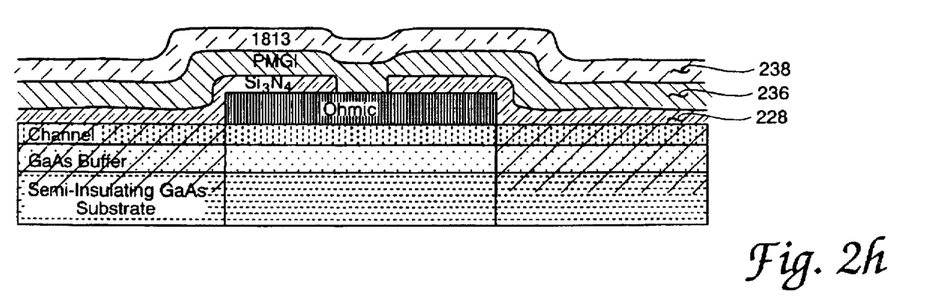
FIG. 2h shows the FIG. 2g structure after an additional processing step.

Next in what may be described as a large feature or optical lithography gate region arrangement of the invention the photoresist layer 230 is removed and two new and differing photoresist layers 236 and 238 are applied to the FIG. 2g structure A large feature arrangement of the invention is generally considered to mean a transistor having a gate region in which the smallest defined feature or the smallest desired dimension is of at least six tenths of a micron in dimensional size. An electron beam exposure-based accomplishment of the invention to achieve gate region dimensions smaller than this six tenths of a micron is described below herein and is considered to represent an alternate arrangement of the invention. The results of this two layer photoresist application is represented in FIG. 2h of the drawings. A photoresist material such as the Shipley type 1813 resist is suitable for the upper photoresist layer 238 in FIG. 2h. A photoresist material such as the Micrographic Chemical Corporation (MCC) type PGMI resist is suitable for the lower photoresist layer 236. The PGMI photoresist layer 236 is of course applied first to achieve the FIG. 2h structure.

Figure 2I:
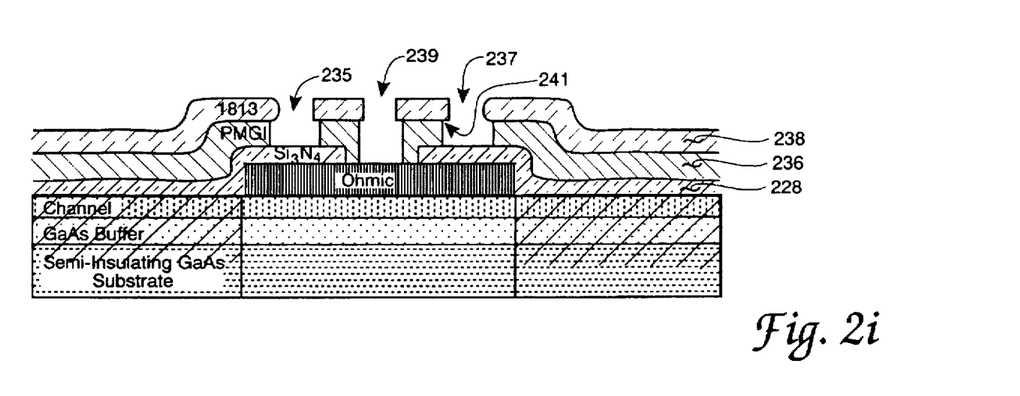
FIG. 2j shows the FIG. 2i structure after an additional processing step.
FIG. 2k shows the FIG. 2j structure after an additional processing step.
FIG. 2l shows the FIG. 2k structure after an additional processing step.
FIG. 2m shows the FIG. 2l structure after an additional processing step.
Figure 2J:
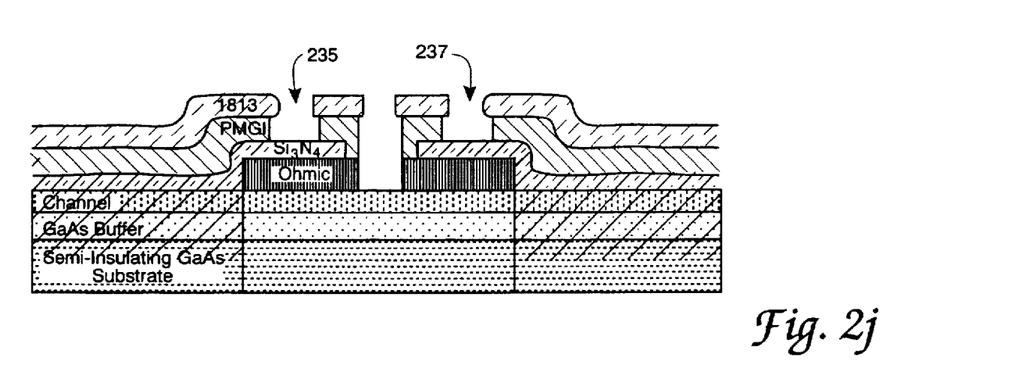
Figure 2K:
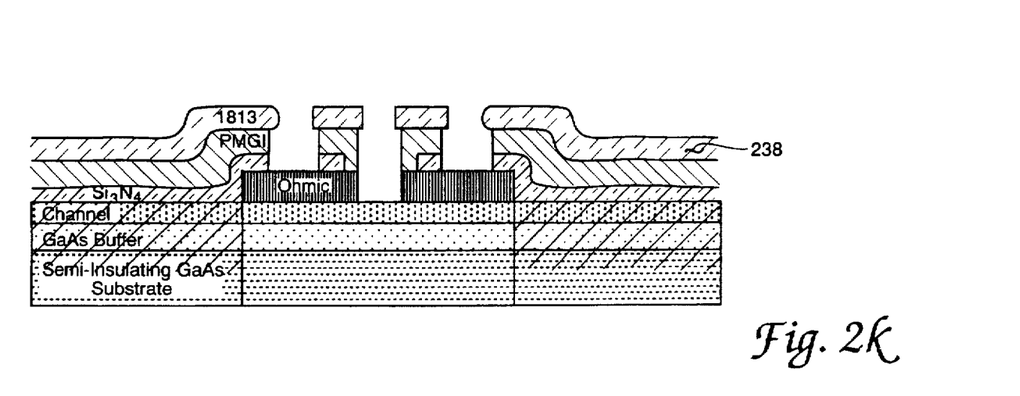
Figure 2L:
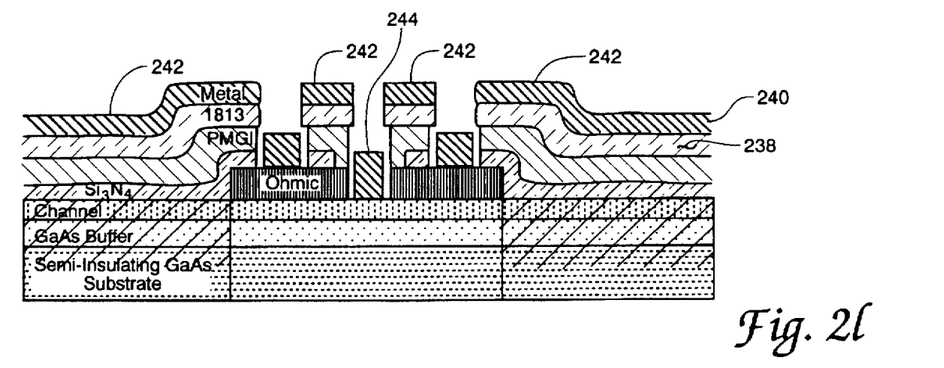

The formation of photolithographically defined source contact and drain contact apertures, 235 and 237, (source and drain respectively for example) in photoresist layer 236 and photoresist layer 238 is indicated in FIG. 2l of the drawings. In addition to these source contact and drain contact apertures the FIG. 2i step may also define additional areas on the secondary mask layer 228 of the transistor. The FIG. 2i step thus also represents the definition of gate geometry, i.e., the gate length and gate width dimensions of the transistor within the aperture 239. (Gate "length" here is presumed, according to convention, to extend in the direction of charge carrier flow). Notably the gate geometry definition in the FIG. 2i step is accomplished on the channel layer 204 while the source and drain definitions occur on the secondary mask layer 228.

It is also notable that the developing and removal of mask aperture areas represented in FIG. 2i have been used to accomplish the upper mask overhang or cliff region indicated at 241 in FIG. 2i. This overhang region assures the presence of metal discontinuities which are useful in separating desired gate source and drain contact metal from undesired excess metal inherently deposited on the upper surface of the photoresist layer 238 during a later metal removal step of the fabrication process. As is known in the lithography art, an over development of the image in the photoresist layer 236 may be used to achieve the lip or overhang or cliff region 241.

In the FIG. 2j drawing use of a selective etch step to remove a gate window sized aperture in the ohmic contact layer 212 is represented. Complete removal of the ohmic contact layer 212 down to the channel layer 204 is desired since the subsequently received gate metal should be located on this channel layer 204. This selective etch of the Table A-indicated indium gallium arsenide material of the ohmic contact layer 212 layer may be accomplished using the citric acid/hydrogen peroxide etchant materials employed in the companion patent document versions of the SLIMFET— except that a different ratio of the citric acid and hydrogen peroxide components is employed to in effect obtain a different etchant system.

A significant requirement for this different etchant system is that it remove the highly doped InGaAs material of the ohmic contact layer 212 much more quickly than it removes the undoped GaAs of the channel layer 204; thereby the GaAs material of the channel layer 204 also serve as an etch stop layer. By fortunate circumstance it is found that a low in hydrogen peroxide modified version of the citric acid etch system used in these companion document versions of the SLIMFET provides the desired characteristics. Specifically an etchant composed of between 0.5:1 and 2:1 ratio citric acid to hydrogen peroxide is preferred for use in the presently described (gallium arsenide metal semiconductor field-effect transistor) arrangement of the invention. It is particularly notable that the source and drain regions of the FIG. 2 transistor, the FIG. 2j regions at 235 and 237, remain protected by the secondary mask layer 228 during this selective etch step. As described below the present MESFET embodiment of the invention may also be arranged to include use of a thin etch stop layer of material such as the aluminum arsenide identified for such use in the copending patent documents identified above. Such a layer is omitted from the present FIG. 2 MESFET but offers fabrication convenience in providing a positive end point for the FIG. 2j etching step with little or no impact on device characteristics.

The protective function of layer 228 suggests, as indicated above, reference to this layer 228 as "a secondary mask layer". Identification of this protective function also enables a better understanding of the importance of secondary mask layer 228 in achieving a transistor according to the present invention. Without the concurrent but different FIG. 2i masks for the regions at 235/237 and 239, a delicate mask realignment step and separate distinct metalization operations for these regions would be required—as is the present state of the field-effect transistor fabrication art. (It is particularly notable, for example, that the process of the above identified U.S. Pat. No. 4,961,194 of S. Kuroda et al., does not include the secondary mask layer 228 and does contemplate such separate metalization steps). In addition to enabling a single common metalization step, the absence of a realignment step is particularly desirable in the gate region of a field-effect transistor since accurate gate placement is needed to obtain optimum performance from a fabricated device.

In addition to use of the doped GaAs of the channel layer 204 as an etch stop layer and the desired removal of highly doped materials in the ohmic contact layer 212 much more quickly than the doped GaAs of the channel layer 204, it is possible of course to include an express etch stop layer in the FIG. 2 MESFET structure. This has been disclosed at 310 in FIG. 3 of the specification relating to several of the transistors in the above-identified copending patent documents.

Such an express etch stop layer is omitted from the drawings herein in view of a normal preference for its absence—but would be located just above the channel layer 204 when used. The relatively thin nature of such an etch stop layer, a layer of thickness measured in tens of angstroms, produces only minor adverse effect on the electrical performance of the completed MESFET device. Such use of an express etch stop layer is of convenience in the device fabrication sequence since it removes an element of time constraint and diligent attention which are inherent in a reliance on differing etch rates. The absence of an etch stop layer with reliance on differing etch rates versus use of an etch stop layer and accepting some minor effect on completed transistor performance represents one of a series of compromises which contribute to making the present invention possible.

FIG. 2k represents accomplishment of a wet chemical etching of the secondary mask layer 228 to expose the ohmic contact layer 212 material of the source and drain regions in the transistor. A buffered oxide etchant (BOE) solution is used for the FIG. 2k source/drain etches; this solution is relatively inactive with respect to the exposed gallium arsenide of the channel layer 204. An etch solution composed of BOE: water in a 1:1 ratio and available from Ashland Chemical Corporation may be used for this purpose. This FIG. 2k etch step notably also represents a selective removal of the secondary mask layer 228 without use of a two step lithographic process.

With the source/drain and gate regions of the FIG. 2k device exposed, a single deposition of metal as represented at 240 in FIG. 2l can be accomplished. A scheme of Titanium Platinum and Gold in the respective thicknesses of 200: 500: 5300 is found desirable for this purpose. Other metal combinations including Titanium and Gold in the thickness range of 6000 Angstroms and also the combination of nickel and gold may be used in this step. Any metal that forms both a Schottky contact to the gallium arsenide (or other selected group III-V gate region semiconductor material) and forms an ohmic contact to highly doped ohmic layer version of this semiconductor material and which can be deposited by evaporation can be used in the present metalization step—as long as the metal also does not degrade the underlying photoresist during deposition. This metalization step forms the gate contact 244 In FIG. 2l and also deposits metal at 242 over the top surface of the FIG. 2m transistor, i.e., over the photoresist layer 238.

This metalization step thereby may be used to form the interconnecting conductors of the transistor including the gate feed and pad regions. For such interconnecting conductor formation it is necessary to have previously removed the photoresist layer 238 at the desired interconnect regions since a metal lift-off step is used subsequently (FIG. 2m) to remove any metal supported only by such photoresist mask material. Since the same photoresist pattern is used both as the gate recess etch mask and as the present gate metal definition mask, the gate metal of the FIG. 2l step will be self-aligned to the etched gate recess region on the FET channel.

By way of the differing semiconductor materials and doping concentrations present in the source/drain 235/237 and gate 239 regions of the FIG. 2 device, i.e., present below the FIG. 2l metalizations, the desired ohmic contact electrical characteristics are obtained at the source/drain contact regions 235/237 and a Schottky barrier electrical characteristic is obtained at the gate contact region 239 with this single metalization step. Since the FIG. 2j photoresist pattern is used both as the gate recess etch mask in FIG. 2j and as the gate metal definition mask in the FIG. 2l step, the gate metal is self-aligned to the etched gate recess region on the transistor channel—as is also desired for achieving the optimum transistor element size and placement and thereby the best transistor yield and performance.

Figure 2M:
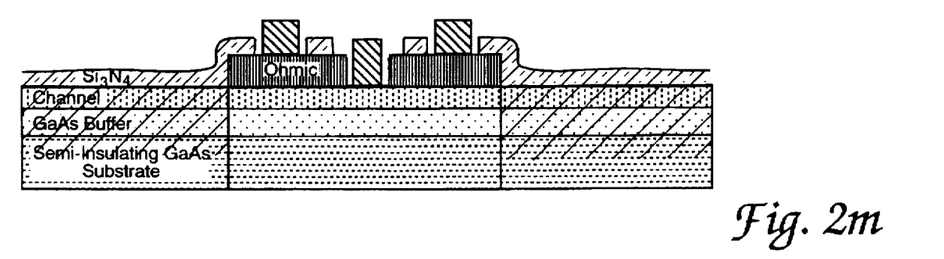

Removal of the photoresist layers 236 and 238 is represented in the FIG. 2m drawing. This removal accomplishes a metal lift-off separation of undesired metal from desired metal by way of the lip or overhang or cliff region 241 areas described previously. The device achieved after this metal lift-off includes non-alloyed contacts in the source/drain and gate regions. Following such metal lift-off the FIG. 2 device is complete and ready for known device incorporation procedures.

FABRICATED DEVICES

Figure 3:
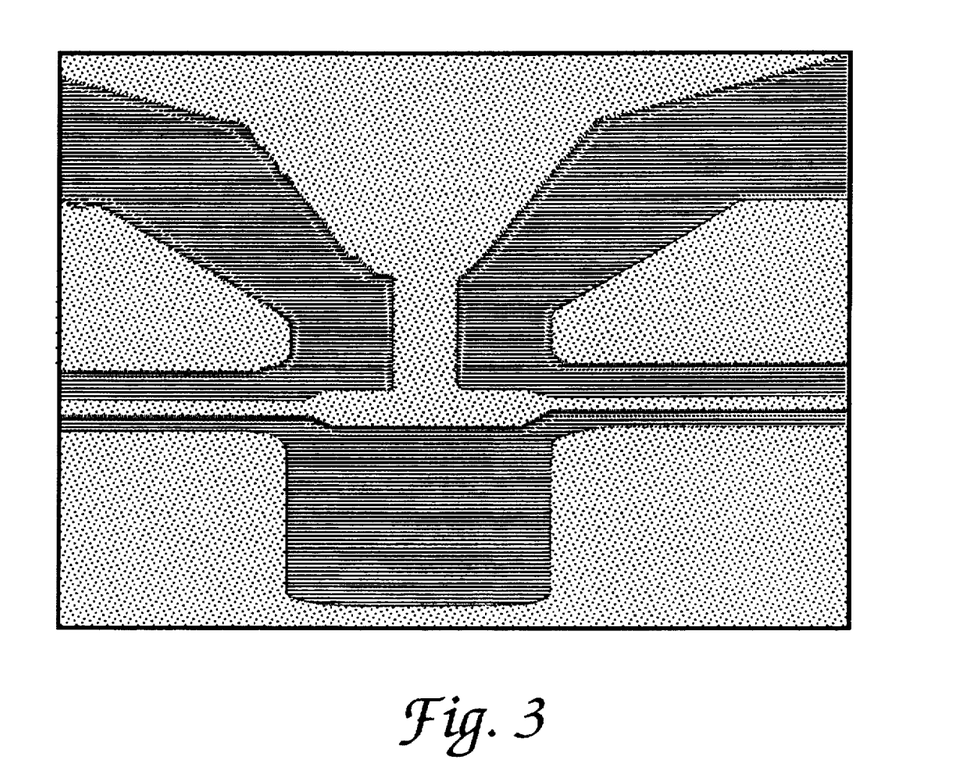
FIG. 3 shows a drawing representation of a top view microphotograph of a transistor according to the invention.

A drawing representation of a scanning electron microscope microphotograph of a MESFET device of 1 micrometer gate size and fabrication according to the present invention appears in FIG. 3 of the drawings. In the FIG. 3 device the single layer of metallization i.e., the absence of metal overlap and the substantial absence of differing heights of the metal in the gate feed and gate contact portions of the transistor are notable features. A line representing a recess generally following the metal outlines also is shown in FIG. 3.

The following paragraphs of fabricated device description relating to these drawings are paraphrased from the above-identified published article of G. C. DeSalvo et al., and describe the electrical characteristics of MESFET devices resulting from a fabrication according to the above described sequence.

GaAs MESFET devices having the structure shown in FIG. 2* were fabricated from two wafers using the SLIM-FET process with an existing FET mask set utilizing optically defined 1 micron gates. A scanning electron microscope (SEM) micro photograph of a completed FET device showing the single layer metalization of the drain, gate, and source contacts using the SLIMFET process is given in FIG. 3*. After contact metalization, the two wafers were not processed further (i.e., no backside processing or circuits were fabricated) and individual FET devices were tested. Ohmic contact resistance was measured using standard transmission line model (TLM) patterns and achieved an average contact resistance of 0.039 $\Omega$mm, a specific contact resistance of $4.13 \times 10^{-7}$ $\Omega$cm$^2$, and a sheet resistance of 37.75$\Omega$/☐for no-alloyed Ti/Au metal on the InGaAs contact layers. These results compare very favorably with earlier results from standard n$^{30}$ GaAs and other InGaAs ohmic contact layers that have been reported.

An I-V transistor curve for the fabricated 50μm wide, two finger, center tapped FET with 1.0 μm gate length is shown in FIG. 4*. The saturated drain-source current ($I_{dss}$) averaged 397 mA/mm, with a peak transconductance of 148 mS/mm between 0.10-0.50 V. The pinch off voltage was measured to be −4.1 V, with a current leakage equal to 1.07 μA/mm. The device channel was designed to have a high pinch-off voltage, as a selective etch is used in the SLIMFET gate recess process to only remove the InGaAs ohmic contact layers and stop on the GaAs channel. RF testing included S-parameter testing from 1-26 GHz, and yielded cutoff frequencies ($f_t$) as high as 15.85 GHz and $f_{max}$ of 51.87 GHz, which are comparable to standard MESFETs fabricated using a conventional process.

In these paragraphs the asterisk-marked drawing references are to the drawings of the published article rather than to the present patent document drawings.

ALTERNATE ARRANGEMENT, SMALL GATE GEOMETRY, EBOL

The MESFET fabrication sequence described thus far in this document has been based on use of optical lithographic exposures for all elements of the transistor. Such elements significantly include the gate and determination of its positional location within the source to drain space of the transistor. Even ultraviolet light-based optical lithographic techniques as contemplated in this description are however limited to feature sizes of about six tenths of a micron and larger since the wavelength of the optical energy employed in the lithography becomes a feature size-limiting factor. Electron beam-based lithography with its higher energy levels and therefore smaller wavelengths offers one alternative to this resolution limitation and enables achievement of the desired smaller features. This relief however, comes at the expense of device processing throughput speed since point by point beam scanning over the transistor features being defined is required and only limited scanning speeds are practical. The combined use of Electron beam-based lithography, for small feature definitions, in a transistor gate region for example, together with optical or ultraviolet exposures for larger device features is described in detail in the co pending patent document titled Single Layer Integrated Metal Process for High Electron Mobility Transistor (HEMT) and Pseudomorphic High Electron Mobility Transistor (PHEMT) AFD 00082, Ser. No. 08/684,761, and especially is described in connection with the views of FIG. 5 in that document The transistor of this Ser. No. 08/684,761copending document differs structurally from that of the present MESFET device primarily in the omission of two layers, the barrier layer 306 and the stop etch layer 310, (in the 08/684,761, application) from the present MESFET device. The present MESFET device also differs in employing a doped channel layer, however, this is considered a non structural difference. The omitted two layers 306 and 310 are each part of the transistor structure which underlies the present invention metalization-related or cap layer structure of a field-effect transistor and therefore do not significantly impact the herein disclosed concepts of the present MESFET arrangement. Since the Ser. No. 08/684,761 document is incorporated by reference herein, an understanding of an EBOL processing-included arrangement of the present invention is believed to be provided from the combination of the instant MESFET device description and the thus also present description of the Ser. No. 08/684,761 document. A repetition of the EBOL concepts disclosed in the Ser. No. 08/684,761 document is therefore believed unnecessary in the present document and is accordingly omitted here.

SEMICONDUCTOR SECONDARY MASK EMBODIMENT

In a similar manner use of a semiconductor material in lieu of the disclosed silicon nitride or silicon dioxide for the secondary mask element, e.g.at 228 in FIG. 2 herein, is described in detail in the co pending patent AFD 00169 Ser. No. 08/684,755 Field-Effect Transistor Process With Semiconductor Mask, Single Layer Integrated Metal, and Dual Etch Stops document and especially is described in connection with the views of FIG. 1 in that document The transistor of this Ser. No. 08684,755 copending document differs structurally from that of the present MESFET device primarily in the addition of etch stop layer 113 and change of the secondary mask layer 128 from silicon nitride to semiconductor material in the device of this Ser. No. 08/684,755 copending document.

Since these two layers may be incorporated in the MESFET structure of the present invention without complication and indeed with some simplification with respect to the presently contemplated silicon nitride secondary mask—and therefore do not significantly impact the herein disclosed concepts of a MESFET arrangement of the invention, an understanding of a semiconductor secondary mask-included arrangement of the present invention is believed to be provided from the combination of the present MESFET device description and the description of the Ser. No. 08/684,755 copending document—which is also incorporated by reference herein. A repetition of the semiconductor secondary mask concepts disclosed in the Ser. No. 08/684,755 copending document is therefore believed unnecessary in the present material and is accordingly also omitted here.

Table B below provides a comparison between the steps used in a conventional field-effect transistor fabrication process and the process of the present invention. Although a first blush review of this comparison table may suggest the present invention steps are almost as numerous as those of a conventional process, a detailed consideration of the data in this table reveals that several of the present invention steps can be accomplished more quickly—by a considerable margin, than is possible in the conventional process.

TABLE B

| SLIMFET Process | Standard FET Process |
| --- | --- |
| 4 Lithography Steps: | 5 Lithography Steps: |
| Mask Alignment | Mask Alignment |
| Device Isolation | Device Isolation |
| Gate Window | Ohmic Metal |
| Ohmic/Gate Feed/Pad/Gate Metal | Gate Feed & Contact Pad Metal |
|  | Gate Metal |
| 2 Metal Depositions and Metal Lift-Off Steps | 4 Metal Depositions and Metal Lift-Off Steps |
| Mask Alignment Marks (Ti/Au) | Mask Alignment Marks (Ti/Au) |
| Ohmic/Contact Pads/Gate (Ti/Au) | Ohmic Contacts (AuGe/Ni) |
|  | Gate Feed & Contact Pads (Ti/Au) |
|  | Gate Contacts (Ti/Au) |
| 0 Metal Alloys | 1 Metal Alloy |
| 1 $Si_3N_4$ Depositions | 0 $Si_3N_4$ Depositions |
| 3 Selective Etch Steps: | 1 Selective Etch Step: |
| Gate Window | Gate Recess |
| Gate Recess |  |
| $Si_3N_4$ Removal for Ohmic Contacts |  |

In particular the elimination of steps involving metalization and its attending lithography from the present SLIMFET process represent notable time and cost savings. The hours of time involved in accomplishing an accurate mask alignment, the time to evacuate a metalization chamber, the time to accomplish metalization, and then the time to relieve the vacuum at a controlled rate typically combine to limit fabrication throughput when multiple metalizations are involved for a device. Many etching steps in comparison are significantly less involvement and lower cost than a metalization step and therefore are of less significance in device fabrication time and bottom line cost. In considering the table B comparison of the present SLIMFET process with a conventional process therefore these second blush detailed factors also merit consideration.

By way of additional comparisons relating to the present invention, it is recognized that conventional transistors of the type described herein make use of the well known gold germanium nickel ohmic contacts and therby achieve wheat is considered to be desirable low electrical resistance at these contacts. It is further recognized that the presently espoused use of what is normally Schottkty metalization, i.e., the herein disclosed titanium platinum gold or platinum gold alloys for example for this ohmic contact function, may be considered an area of device performance compromise, compromise in that somewhat higher source and drain contact resistance can result. With the herein disclosed arrangement of the ohmic contact semiconductor layers of the transistor this tendency toward greater contact resistance is however, limited to a degree believed acceptable in many field-effect transistor uses.

The reward for acceptance of any compromise of this nature is of course realized in the simplification of device processing, probably increased wafer yields and the resulting decrease in device cost. The employment of a single metalization step is of course a notable area of present processing simplification. A significant enabling factor in achieving this single metalization involves use of the relatively inert secondary mask element and the separation of gate region fabrications steps from source and drain region fabrication steps in makes possible.

Another area of present processing simplification which may be viewed as the acceptance of device-impacting compromise resides in the area of combined electron beam and optical lithography steps in a single device. While conventional wisdom may suggest the maintenance of separation between processes involving these two exposure arrangements is desirable—e.g., to avoid their compromising interaction, the present inventors believe the combination of these exposure as disclosed herein and in the literature is sufficiently well tuned so as to have little negative effect on the resulting devices.

Another present process enhancement concerns a selective gate recess etch, which allows for unusually desirable control of the gate etch. Typically, gate recess etching is performed in an Iterative, "etch to a target current" process. The SLIMFET process however, discloses a gate etch that can be accomplished without probing the ohmic contacts and thereby allows the ohmic contacts to be covered with protective $Si_3N_4$ during the gate recess etch. Additionally, the SLIMFET process prevents problems with metal step coverage or metal to metal overlap, problems whose elimination relate closely to yield improvement.

Another feature of the disclosed fabrication is the use of a non-alloy ohmic metal process which further improves device uniformity and eliminates an undesirable high temperature processing sequence. The SLIMFET process also requires only one dielectric deposition step instead of two as in the best existing technique. Metal definition in the disclosed SLIMFET process is by lift-off and not by the more expensive ion milling. This metal lift-off requires no expensive equipment, and does not introduce damage or transistor performance degradation. Finally the employed process for this device is also compatible with monolithic microwave integrated circuit (MMIC) and other fabrication techniques and minimizes process variations, cycle time, and cost.

The present invention is therefore believed to represent the first ever MESFET fabricated using a single layer metalization scheme for both the Schottky gate and ohmic contacts. The SLIMFET process is again achieved through the integration of: the electron-beam/optical lithography process, selective gate recess etching, and non-alloyed ohmic contacts. The SLIMFET process greatly simplifies the fabrication of FET devices while minimizing process variations. The described process is also believed feasible for lower frequency amplifier transistors.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. Field effect transistor apparatus comprising the combination of:
   a lowermost-situated semiconductor material substrate layer;
   a semiconductor material buffer layer overlaying said substrate layer;
   a charged carrier-conveying semiconductor material channel layer overlaying said buffer layer;
   a gate contact member of first metallic composition received on said channel layer, said gate contact member having Schottky barrier electrical characteristics with respect to said channel layer semiconductor material;
   a layer of lower level to upper level composition-graded semiconductor material overlaying said channel layer in surface regions laterally adjoining said gate member;
   a layer of ohmic contact semiconductor material overlaying said graded composition semiconductor material layer in said surface regions laterally adjoining said gate member;
   source and drain contact members of said same first metallic composition received on said ohmic contact semiconductor material layer in laterally opposed locations with respect to said gate member, said source and drain contact members having ohmic electrical characteristics with respect to said semiconductor material of said ohmic contact layer;
   a permanent secondary mask layer overlaying said layer of ohmic contact semiconductor material in regions laterally adjoining said gate contact member and said source and drain contact members;
   said secondary mask layer being a residual mask member retained after use during fabrication of said field-effect transistor apparatus.

2. The field-effect transistor apparatus of claim 1 wherein said semiconductor materials comprise periodic table Group III-IV semiconductor materials.

3. The field-effect transistor apparatus of claim 2 wherein said periodic table Group III-IV semiconductor materials are comprised of gallium arsenide.

4. The field-effect transistor apparatus of claim 3 wherein said permanent secondary mask and passivation layer is comprised of silicon nitride material.

5. The field-effect transistor apparatus of claim 3 wherein said permanent secondary mask and passivation layer is comprised of silicon dioxide material.

6. The field-effect transistor apparatus of claim 5 wherein said gate contact member of first metallic composition and said source and drain contact members of said same first metallic composition are comprised of metals taken from the group consisting of titanium, platinum and gold.

7. The field-effect transistor apparatus of claim 1 wherein:
   said transistor further includes a permanent etch stop layer received over said channel layer;
   said layer of lower level to upper level composition-graded semiconductor material overlays said permanent etch stop layer in surface regions laterally adjoining said gate member;

said gate contact member of first metallic composition is received on said channel layer in a gate aperture region of said permanent etch stop layer;

said gate contact member of first metallic composition is received on said channel layer in a gate aperture region of said lower level to upper level composition-graded semiconductor material.

8. The field-effect transistor apparatus of claim 1 wherein said gate contact element is comprised of a top-heavy mushroom-like cross-sectional shape.

9. A periodic table group III–V semiconductor material field-effect transistor comprising the combination of:

a plurality of periodic table group III–V semiconductor material layers received on a substrate member;

a masking dielectric material layer covering an outermost of said semiconductor material layers and having selected mask apertures therein;

said masking dielectric material layer-covered semiconductor material layers including a charge carrier-communicating field-effect transistor channel layer;

a gate window recess through at least one semiconductor layer covering said channel layer, said gate window recess being in registration with one of said masking dielectric material layer mask apertures;

a Schottky barrier gate element received in charge carrier flow-controlling proximity of said channel layer in said gate window recess;

source and drain contact elements located on laterally opposite sides of said gate window recess and disposed in one of a low energy barrier height, and a tens of angstroms barrier thickness, non-alloyed, low temperature ohmic contact relationship with a semiconductor layer covering said channel layer;

said source and drain contact elements also being each in registration with one of said mask apertures;

said gate element and said source and drain contact elements being comprised of a same metallic common composition.

10. The field-effect transistor apparatus of claim 9 wherein said Schottky barrier gate element is of less than six tenths micron dimension in its source to drain dimensional direction.

11. The field-effect transistor apparatus of claim 9 wherein said Schottky barrier gate element is of greater than six tenths micron dimension in its source to drain dimensional direction.

12. The field-effect transistor apparatus of claim 9 wherein said masking dielectric material layer is comprised of one of the materials of silicon nitride and silicon dioxide.

13. The field-effect transistor apparatus of claim 9 wherein said periodic table group III–V semiconductor material is comprised of one of the materials of gallium arsenide and indium phosphide.

14. The field-effect transistor apparatus of claim 9 wherein one of said plurality of periodic table group III–V semiconductor material layers is a permanent etch stop layer overlaying said channel layer.

15. A gallium arsenide field-effect transistor comprising the combination of:

a plurality of gallium arsenide semiconductor material layers received on a substrate member;

said semiconductor material layers including a charge carrier-communicating field-effect transistor channel layer and an ohmic contact layer located above said channel layer;

a passivation and secondary masking layer covering an outermost of said semiconductor material layers and having selected mask apertures therein;

a gate function to channel layer-accessing gate window recess through said passivation and secondary masking layer and selected of said semiconductor material layers, said gate window recess being in registration with one of said passivation and secondary masking layer mask apertures;

a thin etch stop layer permanently disposed between two adjacent of said semiconductor material layers intermediate said transistor channel and said ohmic contact semiconductor layers, said thin etch stop layer also having a gate window aperture therein;

a metallic gate element contact received on one of said semiconductor layers in Schottky barrier charge carrier flow-controlling proximity of said channel layer in said gate window aperture and gate window recess;

source and drain ohmic metallic contact elements of said same metallic gate element contact composition located on laterally opposite sides of said gate window recess and disposed in one of, a low energy barrier height and a field emission tunneling-dominated barrier, non-alloyed and low temperature-fabricated annealed ohmic contact relationship with said ohmic contact semiconductor layer;

said source and drain contact elements being each also in registration with one of said passivation and secondary masking layer mask apertures.

16. The gallium arsenide field-effect transistor of claim 15 wherein:

said transistor is a metal semiconductor field-effect transistor (MESFET) having channel, and ohmic contact layers;

said passivation and secondary masking layer is disposed directly over said ohmic contact layer;

said source and drain metallic contact elements are located in mask aperture recesses of said passivation and secondary masking layer;

said thin etch stop layer is disposed on said channel layer; and said Schottky barrier metallic gate element contact is disposed on said channel layer within a gate window aperture of said thin etch stop layer.

17. The gallium arsenide field-effect transistor of claim 16 wherein: said passivation and secondary masking layer is comprised of silicon nitride material; and said thin etch stop layer is comprised of aluminum arsenide.

18. The gallium arsenide field-effect transistor of claim 17 wherein said Schottky barrier gate contact element is of at least six tenths of a micron dimension in its source to drain dimensional direction and is disposed in single mask-defined positional registration with respect to said source and drain contact elements.

19. The gallium arsenide field-effect transistor of claim 18 wherein said Schottky barrier gate contact element is of less than six tenths of a micron dimension in its source to drain dimensional direction and is disposed in single mask-defined positional registration with respect to said source and drain contact elements.

20. A partially completed contact-included structure for a group III–V semiconductor material, secondary mask-inclusive metal semiconductor metal field-effect transistor comprising the combination of:

a transistor-divided group III-V semiconductor material field-effect transistor wafer having an etch stop/channel layer and a superimposed group III-V semiconductor material-inclusive ohmic connection layer that is overlaid by a group III-V semiconductor material-inclusive permanent secondary mask layer;

a photoresist mask layer covering said group III-V semiconductor material-inclusive permanent secondary mask layer;

a gate window recess disposed in a transistor-divided region of said wafer and extending through said photoresist mask layer, said permanent secondary mask layer, said ohmic connection layer and said etch stop/channel layer;

source and drain region openings disposed in said transistor-divided region on opposed lateral sides of said gate window recess and extending through said photoresist mask layer and said secondary mask layer to said ohmic connection layer;

a Schottky barrier metal electrical contact received in said gate window recess on said etch stop/channel layer;

a non-alloyed ohmic source electrical contact of said same Schottky barrier metal received on said ohmic connection semiconductor material layer in said source location;

a non-alloyed ohmic drain electrical contact of said same Schottky barrier metal received on said ohmic connection semiconductor material layer in said drain location.

21. The partially completed transistor structure of claim 20 wherein said superimposed ohmic contact layer is comprised of indium doped gallium arsenide material and said etch stop/channel layer is comprised of undoped gallium arsenide material and said ohmic contact layer indium doped gallium arsenide material is characterized by a fast first reaction response characteristic with a selected citric acid/hydrogen peroxide etchant solution in comparison with a slower second reaction response characteristic of said etch stop/channel layer undoped gallium arsenide material with said selected citric acid/hydrogen peroxide etchant solution.

22. The partially completed transistor structure of claim 20 wherein said etch stop/channel layer is comprised of a gallium arsenide layer having an overlaying thin aluminum arsenide etch stop layer attached thereto.

* * * * *